(12) United States Patent
Lu-Ruhbach et al.

(10) Patent No.: US 9,397,652 B2
(45) Date of Patent: Jul. 19, 2016

(54) CIRCUITRY AND METHOD FOR OPERATING SUCH CIRCUITRY

(71) Applicant: Infineon Technologies AG, Neubiberg (DE)

(72) Inventors: Fang Lu-Ruhbach, Vaterstetten (DE); Veli Kartal, Munich (DE); Alfons Graf, Kaufering (DE)

(73) Assignee: Infineon Technologies AG, Neubiberg (DE)

( * ) Notice: Subject to any disclaimer, the term of this patent is extended or adjusted under 35 U.S.C. 154(b) by 151 days.

(21) Appl. No.: 14/095,976

(22) Filed: Dec. 3, 2013

(65) Prior Publication Data
US 2015/0155856 A1     Jun. 4, 2015

(51) Int. Cl.
*H03K 17/687* (2006.01)
*H03K 17/18* (2006.01)
*H03K 17/12* (2006.01)

(52) U.S. Cl.
CPC .............. *H03K 17/18* (2013.01); *H03K 17/122* (2013.01); *H03K 2217/0027* (2013.01)

(58) Field of Classification Search
CPC .............................. H03K 17/18; H03K 17/122
See application file for complete search history.

(56) References Cited

U.S. PATENT DOCUMENTS

| 6,903,595 | B2 * | 6/2005 | Won | H03K 17/063 327/403 |
| 7,576,588 | B2 * | 8/2009 | Wang | H03K 17/04123 327/376 |
| 8,207,760 | B2 * | 6/2012 | Pham | H03K 17/04206 326/85 |
| 2002/0021150 | A1 * | 2/2002 | Tuchiya | H02M 3/073 327/108 |
| 2007/0046358 | A1 * | 3/2007 | Wang | H03K 17/04123 327/376 |
| 2013/0106491 | A1 * | 5/2013 | Ryu, II | G11C 8/08 327/407 |
| 2015/0035385 | A1 * | 2/2015 | Sander | H03K 17/0822 307/125 |

FOREIGN PATENT DOCUMENTS

DE     102014117580 A1 *  6/2015 ........... H03K 17/122

* cited by examiner

*Primary Examiner* — Ryan Jager
(74) *Attorney, Agent, or Firm* — Slater Matsil, LLP (57) ABSTRACT

A circuitry is suggested, in particular a power switch, comprising a first electronic switch with an isolated gate; a second electronic switch with an isolated gate; a measuring device for determining a charge at the isolated gate of the first electronic switch and at the isolated gate of the second electronic switch; an energy supply for providing charge to the isolated gate of the first electronic switch and to the isolated gate of the second electronic switch based on the charge determined by the measuring device; a logic unit for activating either the first electronic switch, both or none of the electronic switches.

36 Claims, 5 Drawing Sheets

| State | Rds_on (mΩ) | Protection Functions | | | |
|---|---|---|---|---|---|
| | | Current sense | Itrip (A) | Vds detection | Over temperature protection |
| First ON state | 1 | Yes, kilis= 300~60k | Yes, @ Itrip=150A switch OFF autonomously & latch | No | Yes, switch OFF autonomously & latch |
| Second ON state | 200 | Yes, Kilis=300 | Yes, @ Itrip=150A switch OFF autonomously & latch | No | Yes, switch OFF autonomously & latch |
| Second IDLE state | 200 | No | No | Yes, If Vds>500mV -> switch OFF autonomously & latch | Yes, switch OFF autonomously & latch |
| First IDLE state | 1 | No | No | Yes, If Vds>100mV -> switch OFF autonomously & latch | Yes, switch OFF autonomously & latch |
| OFF state | ∞ | No | No | Check open load in OFF, detection level Vds=2,5V | No |

CIRCUITRY AND METHOD FOR OPERATING SUCH CIRCUITRY

BACKGROUND OF THE INVENTION

Embodiments of the present invention relate to a current-optimized control for an electronic switch.

SUMMARY

A first embodiment relates to a circuitry, in particular a power switch, comprising
- a first electronic switch with an isolated gate;
- a second electronic switch with an isolated gate;
- a measuring device for determining a charge at the isolated gate of the first electronic switch and at the isolated gate of the second electronic switch;
- an energy supply for providing charge to the isolated gate of the first electronic switch and to the isolated gate of the second electronic switch based on the charge determined by the measuring device;
- a logic unit for activating either the first electronic switch, both or none of the electronic switches.

A second embodiment relates to a vehicle comprising at least one circuitry as described herein.

A third embodiment relates to a method for controlling a first electronic switch with an isolated gate and a second electronic switch with an isolated gate, comprising the steps:
- determining charge at the isolated gate of the first electronic switch and at the isolated gate of the second electronic switch;
- providing charge to the isolated gate of the first electronic switch and the isolated gate of the second electronic switch based on the charge determined;
- activating either the first electronic switch, both or none of the electronic switches.

A forth embodiment is directed to an electronic switching circuitry comprising:
- means for determining charge at an isolated gate of a first electronic switch and at an isolated gate of a second electronic switch;
- means for providing charge to the isolated gate of the first electronic switch and the isolated gate of the second electronic switch based on the charge determined;
- means for activating either the first electronic switch, both or none of the electronic switches.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Examples presented herein refer to power switches that may be used to replace passive fuses or relays in devices, e.g., in the automotive field, in particular in vehicles such as cars. Hereinafter, the term electronic switch may be used for any sort of electronic switching functionality in various use case scenarios. The electronic switch may comprise at least one of the following: a transistor, a PMOS, an NMOS, a FET, a JFET, an IGBT, etc. The electronic switch may have an isolated gate which may serve as a control input. The device described herein may be any device that can be subject to a low power or standby mode. The device may in particular be a car, a control unit of a car. Car or vehicle referred to hereinafter are examples for such devices. The solution presented, however, is not limited to such devices.

The solution can be used in a high current switching scenario. The solution may be realized on a single chip (e.g., piece of semiconductor) or it may be distributed among various components, e.g., chips.

The solution may refer to four or five states of a power switch comprising:
- an OFF state;
- a first IDLE state;
- a first ON state;
- a second ON state; and
- optional: a second IDLE state.

The first ON state may correspond to a high power on state supporting a high current (e.g., 30A). The first ON state may in this regard correspond to an on state of a relay. When used in an automotive environment, the first ON state of the power switch may be used, e.g., when a vehicle is driving.

The first IDLE state may support a high current, but in this state, the power switch itself only consumes a small amount of power, e.g., in the range below 100 µA. This may apply—with regard to the automotive scenario—to the vehicle being in a parking state.

A current sensing functionality may be provided that allows for an autonomous or controlled (e.g., by a microcontroller, processor) transition to another state in case a current sensed fulfills a predetermined condition, e.g., reaches or exceeds a predetermined threshold. In such case, overcurrent protection can be realized by providing a switching off functionality, i.e. by entering the OFF state.

An overcurrent can be detected, e.g., in the (first or second) IDLE state and it may autonomously lead to a transition to the OFF state thereby providing the functionality of a fuse.

The level of the overcurrent to trigger entering the OFF state can be controlled. This applies to the transition(s) from the ON state and/or the IDLE state and it allows adjusting the safety functionality according to a load (e.g., a wire).

Current sensing of high currents can be achieved in the first IDLE state and current sensing of low currents can be achieved in the second IDLE state. For example, in the second IDLE state, currents up to 10 mA can be sensed when usually no current at all should be present. According to another example, in the second IDLE state, currents up to 150 A can be sensed. The power switch may thus provide a solution for switching ranges of currents to be sensed by using either the first IDLE state or the second IDLE state.

The switching between the ranges for current detection may be realized by switching between on-resistances of two switches that are arranged in parallel to each other, wherein one of the switches has a low resistance and the other is of higher resistance. Preferably, the two switches have a different sense current ratio comparable to different shunt resistors used for shunt current detection.

The power switch allows to provide a high current carrying capacity without interruption even in case the low current sensing range is activated. This feature can be realized by autonomously changing the state of the power switch, i.e.

entering the high current sensing range if needed thereby avoiding any damage on the circuit, in particular the at least one switch of the power switch and at the same time supply current (changes) without any interruption for the load connected to the power switch.

The different states of the power switch may be controlled via control terminals, which can be driven by a microcontroller.

In case of a failure and/or by exceeding a predetermined threshold, the power switch may safely enter a predefined state: For example the power switch may enter its OFF state in case an overcurrent is detected or in case a temperature exceeding a predetermined limit is detected. As another example, a different current sensing range can be autonomously selected in case the current exceeds a(nother) predefined threshold.

As an option, a failure flag may be set in case the power switch has conducted an autonomous state change.

It is a further option that the power switch after a voltage drop of a predefined amount and/or exceeding the predefined amount, remains in the state in which it was prior to the voltage drop. This may apply to the ON state, the first IDLE state, the second IDLE state and the OFF state.

The examples described herein can be utilized in but are not limited to an automotive scenario. For example, vehicles pass through various states (e.g., driving, parking, waiting) and may even have several stages of standby states. These states may require for different current carrying capacities as well as different current sense ranges. Power switches applied may have to cope with these demands and may also consume only little power when active (depending on the state the vehicle is in). The operation of the power switch may work seamlessly without interruptions and provide a safety functionality for the vehicle.

The solution presented may be realized in a single semiconductor chip. In an example, a power switch with various states is implemented in one chip. In particular, several such power switches can be implemented in a single chip. As an option, other circuitry can be realized on the same chip. A logic unit to control the power switch, in particular the states and the state transition of the power switch, may be deployed on the semiconductor chip as well. The logic unit may also be provided separately. It is an option that the logic unit controls more than one power switch.

The power switch may cover a current in the range from, e.g., 10 mA to 30 A. As an option, several power switches may be arranged in parallel to cover current ranges higher than 30 A.

An exemplary use case scenario may be a power switch in a vehicle's electrical system. The power switch provides safety as well as monitoring functionality. The power switch may be used for high current loads as well as low current loads and it may support various states of the vehicle.

The power switch may be controlled by a processor or microcontroller, e.g., via terminals. This allows for flexible and individual applications of the power switch in various scenarios. It is in particular feasible to protect current paths to loads in the vehicle's electrical system even for the vehicle being in different states (e.g., driving, stand-by, parking, etc.).

The states of the power switch may be monitored and a transition to another state may be trigged based on a predefined condition. This allows protecting the vehicle as well as the power switch.

As an option, a feedback-mechanism can be provided to detect, e.g., a transition between states of the power switch that was not triggered externally, but internally. This way, an autonomous state transition can be, e.g., flagged, to a microcontroller driving the power switch.

The power switch may in particular supply a cold starting robustness of up to, e.g., 3.2V.

Figure 1:
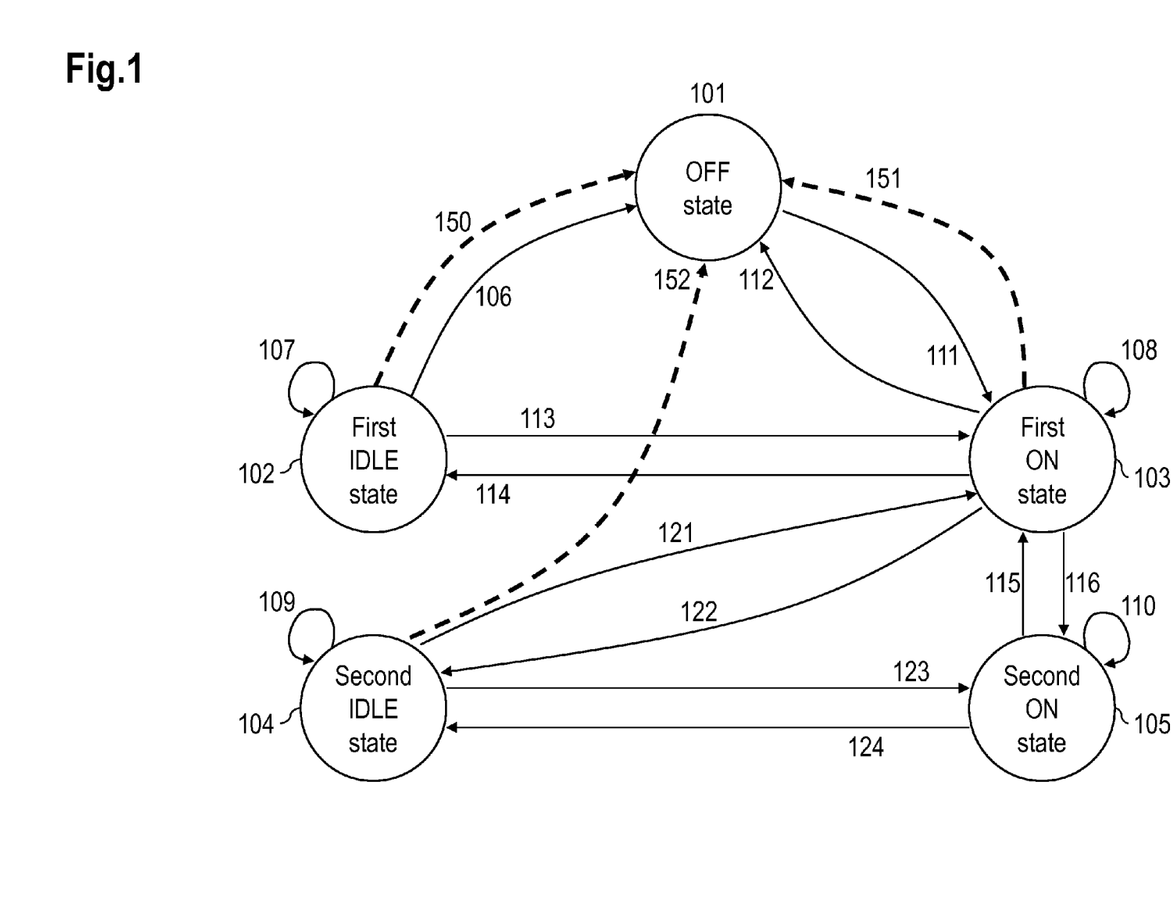
FIG. 1 shows a state diagram of a power switch comprising an OFF state, a first IDLE state, a first ON state, a second IDLE state and a second ON state.

FIG. 1 shows a state diagram of a power switch comprising
an OFF state 101;
a first IDLE state 102;
a first ON state 103;
a second ON state 105; and
optional: a second IDLE state 104.

In the following, the states of the power switch may be explained in more detail:

(1) OFF State 101:

The OFF state 101 may have two internal states: a fail OFF state with a latch being set and a normal OFF state. In case the power switch reaches the OFF state 101 based on an internal safety feature, the fail OFF state indicates via the latch (which may be realized as a flag that can be set or re-set) that the OFF state 101 has been reached by internal mechanisms and not by external control. The normal OFF state indicates that the whole switch (e.g., chip if realized as a single chip) has been deactivated (e.g., due to an external control signal). In the OFF state 101, the switch consumes very little power.

(2) First ON State 103:

In the first ON state 103, a low drain source resistance may be activated, the power switch may have a low DMOS resistance, normal power consumption and provides full safety functionality. Such safety functionality may comprise:

overcurrent protection;
over-temperature protection;
polarity protection; and
protection of the logic circuitry against wrong direction of current.

Preferably, the available DMOS area is activated thereby providing a high current carrying capacity.

High Currents can be sensed. An information regarding the current sensed can be supplied via at least one terminal to a microcontroller and thereby used to emulate a fuse via software, i.e. the fuse functionality may depend on the amount of current sensed.

This first ON state 103 is in particular used during an active state of a vehicle driving around or during a current sense functionality provided during a parking state of the vehicle.

(3) First IDLE State 102:

In the first IDLE state 102, the power switch has a low drain source resistance and consumes very little power (e.g., around 30 μA). The switch may provide basic safety features, e.g., overvoltage protection (in case the drain source voltage reaches or exceeds a predetermined threshold) and over-temperature protection.

The IDLE state 102 may be used when a vehicle is in a long term parking state.

The power switch may change from the IDLE state 102 into the first ON state 103 and/or into the second ON state 105, triggered by a control unit (e.g., a microcontroller), for conducting a current sense. After the current sense has been conducted, the power switch may return to the IDLE state 102.

(4) Second ON State 105:

In the second ON state 105, the power switch has a higher drain source resistance than in the first ON state 103, normal power consumption and limited safety functionality: In case of overcurrent and/or over-temperature, the power switch is switched off.

In the second ON state 105, the power switch can sense small currents (e.g. 10 mA). This allows detecting a very low leakage current thereby protecting the electrical system of a vehicle more efficiently.

The current sensed (or any information regarding the current sensed) can be supplied via at least one terminal to a microcontroller and it can be used to emulate a fuse via software for protection of a low power load and/or a thin wire, e.g., in a range between 10 mA and 1.5 A.

This second ON state 105 can be beneficially used for accurate measurements of small currents, e.g., during a driving state or a parking state of a vehicle.

(5) Second IDLE State 104:

In the second IDLE state 104 the power switch has a higher drain source resistance than in the first IDLE state 102 and consumes very little power (e.g., around 30 μA). The switch may provide basic safety features, e.g., overvoltage protection (in case the drain source voltage reaches or exceeds a predetermined threshold) and over-temperature protection.

The second IDLE state 104 may be used when a vehicle is in a long term parking state in which a connection to a thin wire or a high-impedance load may be used.

The power switch may change from the second IDLE state 104 into the first ON state 103 and/or into the second ON state 105, triggered by a control unit (e.g., a microcontroller), for conducting a current sense. After the current sense has been conducted, the power switch may return to the second IDLE state 104.

According to an example, the power switch may comprise two electronic switches referred to as DMOS A and DMOS B. The DMOS A and B may share a DMOS area at a ratio 200:1 (A:B). In the second IDLE state 104 and in the second ON state 105, only DMOS B is activated and in the first IDLE state 102 and in the first ON state 103, DMOS A and DMOS B are activated. Each of the electronic switches may comprise a drain, a source and a gate terminal. Hence, the DMOS A may be referred to as high power DMOS and the DMOS B may be referred to as low power DMOS.

It is noted that other types of electronic switches may be used as well. For example, a transistor, a PMOS, an NMOS, a FET, a JFET, an IGBT, etc. It is further noted that DMOS A and/or DMOS B may each comprise at least one electronic switch.

A low power charge pump may be used to drive the electronic switches of the power switch in the first IDLE state 102 and in the second IDLE state 104 and a high power charge pump may be used to drive the electronic switches in the first ON state 103 and in the second ON state 105.

Various kinds of charge pump(s) could be realized, for example two charge pumps as indicated above, e.g., a high power charge pump and a low power charge pump. As an alternative, a single charge (e.g., high power) pump could be used. It is also an option that the single charge pump may comprise two charge-pump functionalities (of the low and high charge pumps) as described above to provide enabling the low power mode of the electronic switch as well as its associated components (e.g., driver, comparator, etc.).

Hereinafter, transitions shown in FIG. 1 are exemplarily described:

Transition 106: The state change from the first IDLE state 102 to the OFF state 101 is conducted in case a fast off switching is indicated by an external controller (e.g., microcontroller).

Transition 150: The state change from the first IDLE state 102 to the OFF state 101 is conducted in case of one of the following conditions:

a drain source voltage of one of the electronic switches of the power switch exceeds a predetermined threshold, e.g., 100 mV;

an over-temperature condition is fulfilled.

Transition 107: The power switch remains in the first IDLE state 102 in case a high current is to be maintained. The source drain voltage at the power switch (e.g., the low power DMOS B of the power switch) does not exceed a predetermined current and/or temperature protection level.

Transitions 113 and 114: The transition 113 from the first IDLE state 102 to the first ON state 103 is conducted in case the high load current is still required and a diagnostic and sensing functionality is required. Accordingly, the transition 114 is conducted when the diagnostic and sensing functionality is no longer required.

Transitions 111 and 112: The transition 111 from the OFF state 101 to the first ON state 103 is conducted in case the power switch is activated. Accordingly, the transition 112 is conducted when the power switch is deactivated (switched off).

Transition 151: The transition 151 is the result of another autonomous protection feature of the power switch: If a overcurrent protection threshold reaches or exceeds a predetermined limit or if a (over-)temperature condition is fulfilled, the power switch enters the OFF state 101 from the first ON state 103.

Transition 108: The power switch remains in the first ON state 103 in case the load maintains requiring a high current and in case full protection and sensing functionality is required.

Transition 116: The transition 116 from the first ON state to the second ON state indicates that the load current reaches or falls below a predetermined threshold (e.g., 10 A) and that the DMOS A is switched off to activate the low current sensing range.

Transition 115: The transition 115 from the second ON state to the first ON state indicates that the load current reaches or exceeds a predetermined threshold (e.g., 2.5 A) and that the DMOS A is switched on to activate the high current sensing range and enter a reduced power consumption mode of the power switch.

Transition 110: The power switch remains in the second ON state 105 in case the load current remains to be low (e.g., below the threshold of 2.5 A) and in case full protection and sensing functionality is required. Also the power switch remains in the low current sensing range.

Transitions 123 and 124: The transition 124 from the second ON state 105 to the second IDLE state 104 is conducted in case the load current remains to be low (e.g., below the threshold of 2.5 A) and a (e.g. periodic) diagnostic and sensing functionality is not required. Accordingly, the transition 123 is conducted when the diagnostic and sensing functionality is required.

Transition 109: The power switch remains in the second IDLE state 104 in case the load current remains to be low (e.g., below the threshold of 2.5 A). The source drain voltage at the power switch (e.g., the low power DMOS B of the power switch) does not exceed a predetermined current and/or temperature protection level.

Transitions 121 and 122: The transition 121 from the second IDLE state 104 to the first ON state 103 is conducted in case the load current switches between large and small (e.g., being larger than 2.5 A and being smaller than 2.5 A) and in case a (e.g. periodic) diagnostic and sensing functionality is required. Accordingly, the transition 122 is conducted in case the load current is small and the diagnostic and sensing functionality is not required.

Transition 152: The state change from the second IDLE state 104 to the OFF state 101 is conducted in case of one of the following conditions:
- a drain source voltage of one of the electronic switches of the power switch exceeds a predetermined threshold, e.g., 500 mV;
- an over-temperature condition is fulfilled.

The transitions 150 to 152 may be a result of integrated autonomous protection features of the power switch. The remaining transitions may be a result of an external trigger or control signal provided by, e.g., a microcontroller.

Figure 2:
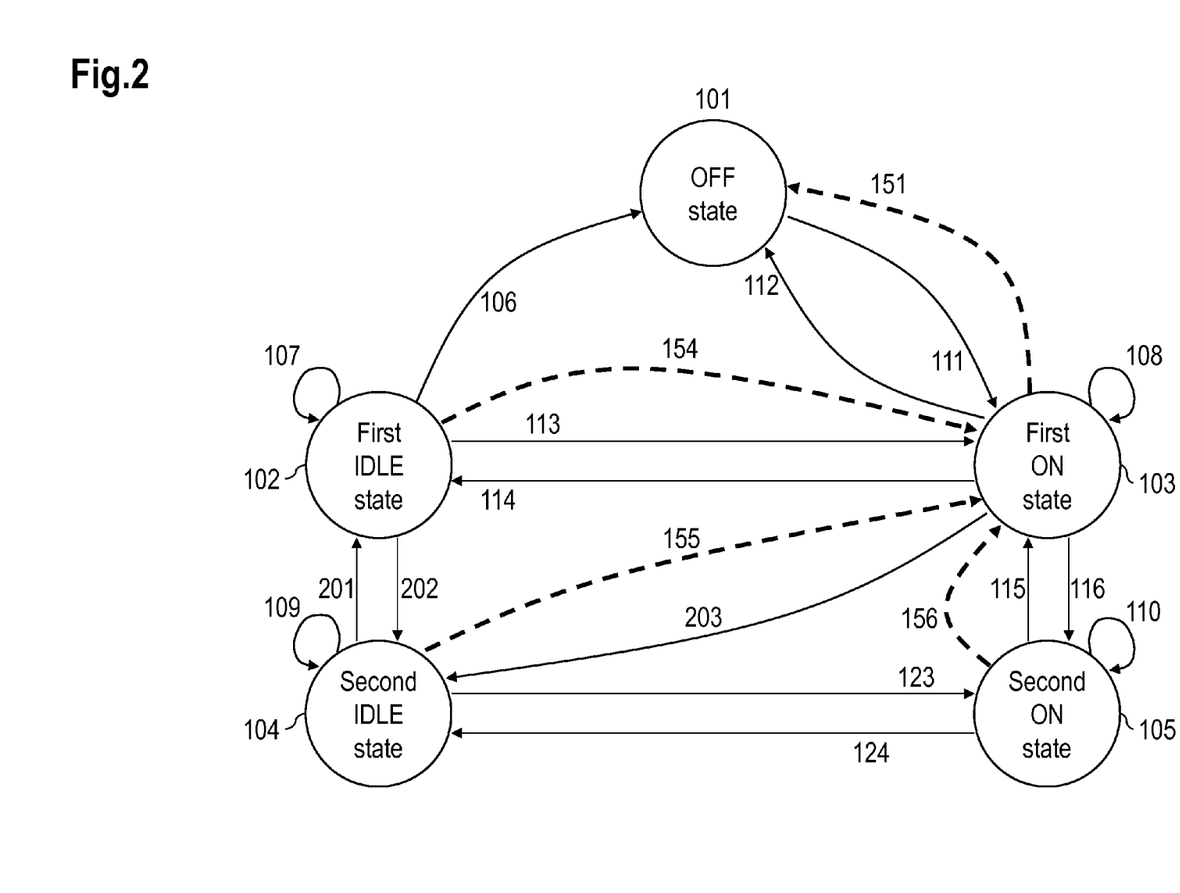
FIG. 2 shows an alternative state diagram for a power switch based on the state diagram shown in FIG. 1.

FIG. 2 shows an alternative state diagram for a power switch comprising some of the states shown in FIG. 1. In addition to what is described above with regard to FIG. 1 the following transitions are introduced in FIG. 2:

Transition 202: The transition 202 from the first IDLE state 102 to the second IDLE state 104 is conducted if a low load current (e.g., below 2.5 A) is determined. The DMOS A is switched off to activate a low power consumption mode of the power switch.

Transition 201: The transition 201 from the second IDLE state 104 to the first IDLE state 102 is conducted if a drain source voltage of one of the electronic switches of the power switch exceeds a predetermined threshold, e.g., 500 mV. The DMOS A is switched on to reduce the resistance (drain source resistance) of the power switch.

Transition 203: The transition 203 from the first ON state 103 to the second IDLE state 104 is conducted if a low load current (e.g., below 2.5 A) is determined. The DMOS A is switched off to activate a low power consumption mode of the power switch.

Transition 154: The state change from the first IDLE state 102 to the first ON state 103 is conducted in case a drain source voltage of one of the electronic switches of the power switch exceeds a predetermined threshold, e.g., 100 mV, as well as the over-temperature condition is fulfilled.

Transition 155: A state change from the second IDLE state 104 to the first ON state 103 is conducted in case a drain source voltage of one of the electronic switches of the power switch exceeds a predetermined threshold, e.g., 500 mV, as well as the over-temperature condition is fulfilled.

Transition 156: The state change from the second ON state 105 to the first ON state 103 is conducted in case of one of the following conditions:
- a drain source voltage of one of the electronic switches of the power switch exceeds a predetermined threshold, e.g., 500 mV;
- an over-temperature condition is fulfilled.

The transitions 151 and 154 to 156 may be a result of integrated autonomous protection features of the power switch. The remaining transitions may be a result of an external trigger or control signal provided by, e.g., a microcontroller.

Figure 3:
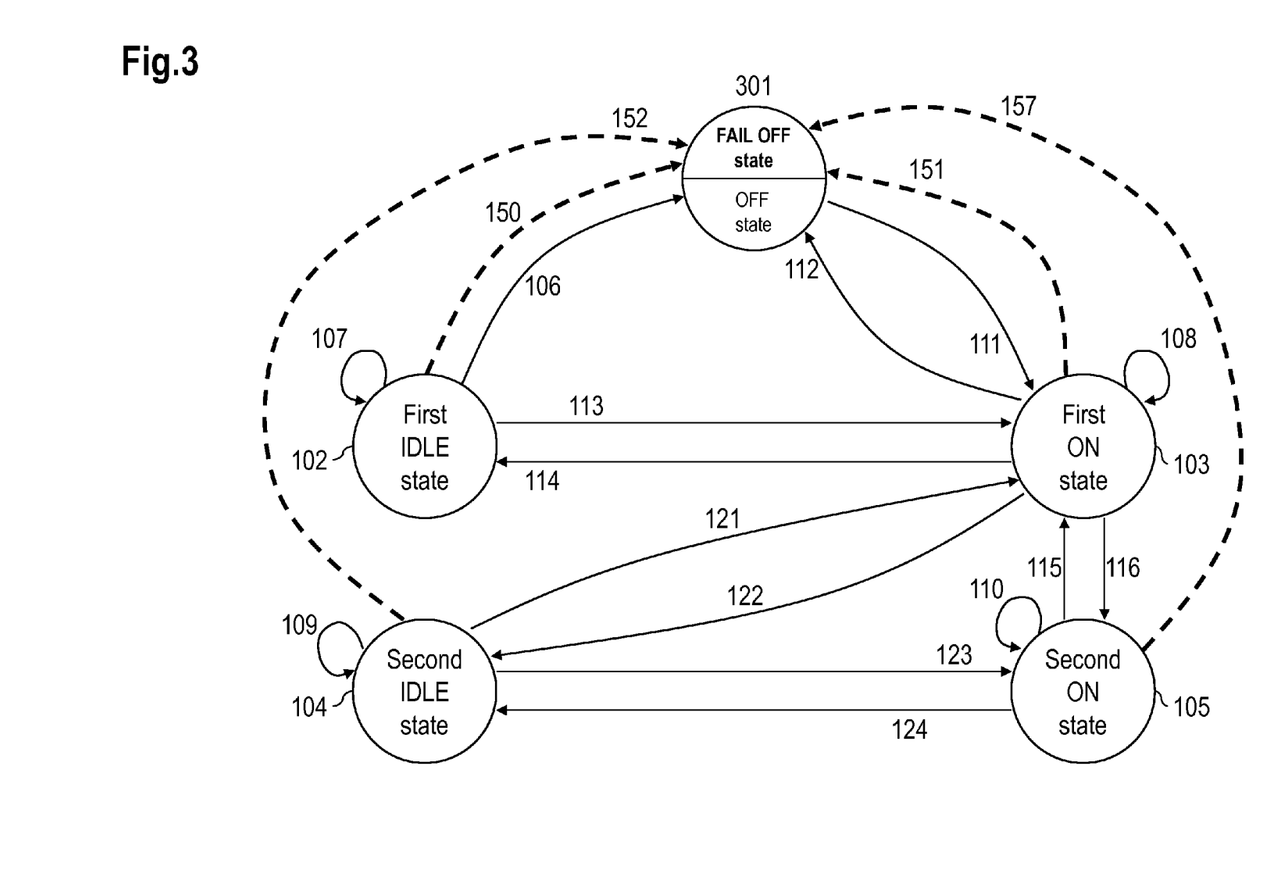
FIG. 3 shows another state diagram for a power switch based on the state diagram shown in FIG. 1.

FIG. 3 shows another alternative state diagram for a power switch based on the diagram shown in FIG. 1. In contrast to FIG. 1, the state 101 is replaced by a state 301 comprising a FAIL OFF state and an OFF state. The transitions 150 to 152 and a transition 157 are directed to the FAIL OFF state, which may comprise a latch or a flag that allows detecting that a transition that triggered the state 301 was based on an autonomous protection feature of the power switch. The transitions 106 and 112 are directed to the OFF state portion of the state 301.

In addition to what is described above with regard to FIG. 1 the following transition is introduced in FIG. 3:

Transition 157: If a (over-)temperature condition is fulfilled, the power switch enters the (FAIL) OFF state 301 from the second ON state 105.

Before reaching the OFF state, the DMOS devices (drivers) of the power switch may both be activated so that both DMOS devices may share the clamping energy.

Figure 4:
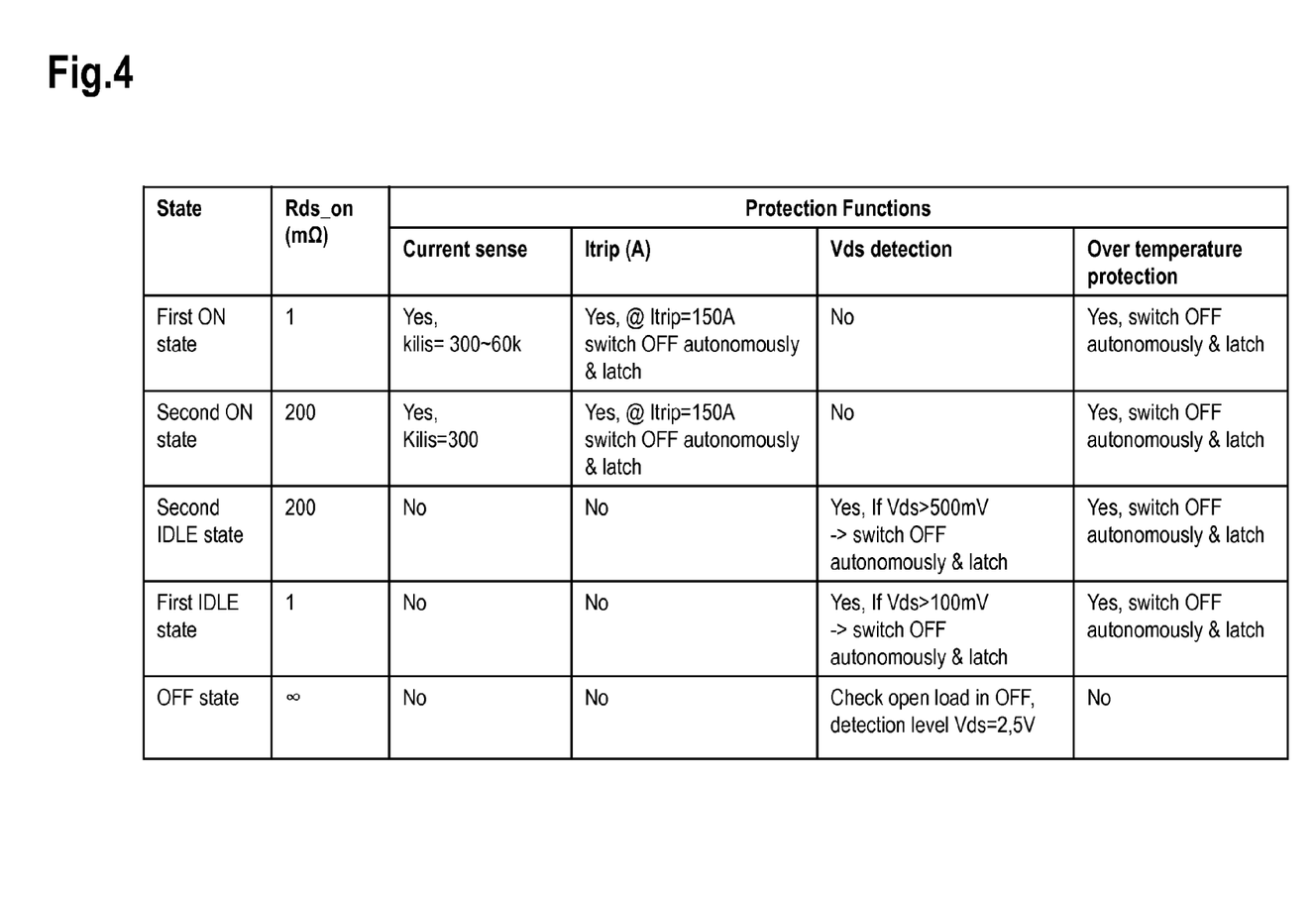
FIG. 4 shows a summarizing table of various states of a power switch.

FIG. 4 shows a summarizing table of the various states 101 to 105 in view of the drain source resistance (Rds_on) and the protection functions provided for each of the states 101 to 105. The current sense feature is available in the first and second ON state, respectively, wherein "kilis" determines a current sense signal ratio (load current divided by sense current). Also, the first and second ON state is capable of detecting a current exceeding an overcurrent protection threshold (Itrip) amounting to, e.g., 150 A. In such case, the power switch may be autonomously switched off thereby setting a latch indicating that the OFF state has been entered due to an internal protection feature.

In the IDLE states, a drain source voltage (Vds) detection is feasible, wherein different Vds thresholds may apply. In such case, the power switch may be autonomously switched off thereby setting the latch indicating that the OFF state has been entered due to an internal protection feature.

In the OFF state an open load can be checked and compared with a predetermined Vds threshold.

(Over-)Temperature protection is feasible in any of the ON and IDLE states. In case an (over-)temperature event is detected, the power switch may be autonomously switched off thereby setting the latch indicating that the OFF state has been entered due to an internal protection feature.

Figure 5:
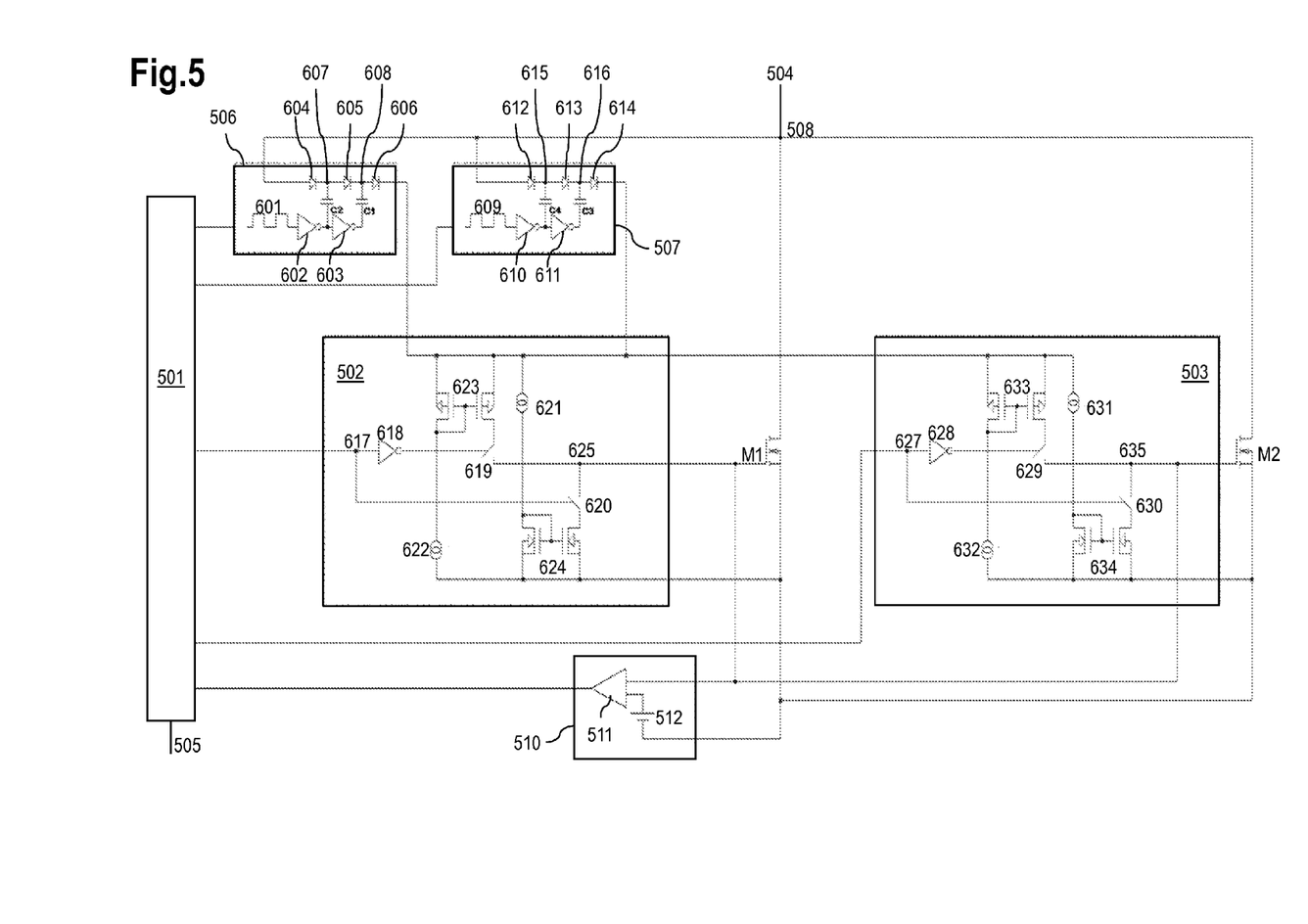
FIG. 5 shows a schematic block diagram of a power switch.

FIG. 5 shows an exemplary block diagram with an n-channel MOSFET M1 that is driven by a (gate) driver 502 and an n-channel MOSFET M2 that is driven by a (gate) driver 503. The drain of the MOSFET M1 and the drain of the MOSFET M2 is connected to a node 508, which is connected to a supply voltage 504. The source of the MOSFET M1 is connected to the source of the MOSFET M2. Both sources of the MOSFETs M1 and M2 may be connected to ground via a resistor (not shown in FIG. 5).

It is noted that the MOSFET M2 may correspond to the high power DMOS A and the MOSFET M1 may correspond to the low power DMOS B (as explained above). Hence,
- in the first IDLE state and in the first ON state, both MOSFETS M1 and M2 are active, whereas
- in the second IDLE state and in the second ON state, only the MOSFET M1 is active.

A logic unit 501 controls the driver 502 and the driver 503. The logic unit 501 may be any sort of control device, e.g., a microcontroller, a controller, a processor or the like. The logic unit 501 may control a high power charge pump 506 and a low power charge pump 507. The high power charge pump 506 and the low power charge pump 507 are each connected to the supply voltage 504 and provide power to the drivers 502 and 503 depending on the control signal(s) applied by the logic unit 501.

The logic unit 501 is controlled via a single input pin 505. As an option, several input pins can be provided (not shown in FIG. 1) to supply external signals to the logic unit 501. The logic unit 501 can be part of a single chip solution. As an alternative, at least a part of the logic unit 501 can be arranged separately, in particular separately to the charge pumps 506, 507, the drivers 502, 503 and/or the switches M1, M2.

However, instead of a huge number of input pins, the logic unit 501 may comprise a decoder that is able to decode various patterns ("command"), e.g., sequence of bits, to determine which decision to make. Based on the (number of) input pins and/or such patterns, the user has a high degree of flexibility to utilize the various functionalities of the electronic switch and the components driving the electronic switch, in particular with regard to low energy modes.

The high power charge pump 506 shows an oscillator signal 601 that is fed to an inverter 602. The output of the inverter 602 is connected via a capacitor C2 to a node 607 and via a series connection comprising an inverter 603 and a capacitor C1 to a node 608. The node 508 is connected via a diode 604 to the node 607 and the node 607 is connected via a diode 605 to the node 608. The node 608 is connected via a diode 606 to the driver 502 and to the driver 503. All diodes 604, 605 and 606 are arranged such that their cathode points towards the drivers 502, 503.

The low power charge pump 507 shows an oscillator signal 609 that is fed to an inverter 610. The output of the inverter 610 is connected via a capacitor C4 to a node 615 and via a series connection comprising an inverter 611 and a capacitor C3 to a node 616. The node 508 is connected via a diode 612 to the node 615 and the node 615 is connected via a diode 613 to the node 616. The node 216 is connected via a diode 614 to the driver 502 and to the driver 503. All diodes 512, 513 and 514 are arranged such that their cathode points towards the gate drivers 502, 503.

The gate driver 502 comprises two current mirrors 623, 624 and two current sources 621, 622. The logic unit 501 controls the gate driver 502: a signal applied to a node 617 activates either a switch 620 (if the signal supplied by the logic unit 501 is high) or—via an inverter 618—the switch 619 (if the signal supplied by the logic unit 501 is low). If the switch 620 is activated, the current of the current source 621 is mirrored to a node 625 and thus used to control the gate of the MOSFET M1. If the switch 619 is activated, the current of the current source 622 is mirrored to the gate of the MOSFET M1. Hence, the logic unit 501 may indicate to the gate driver to actively charge or discharge the gate of the MOSFET M1.

The gate driver 503 comprises two current mirrors 633, 634 and two current sources 631, 632. The logic unit 501 controls the gate driver 503: a signal applied to a node 627 activates either a switch 630 (if the signal supplied by the logic unit 501 is high) or—via an inverter 628—the switch 629 (if the signal supplied by the logic unit 501 is low). If the switch 630 is activated, the current of the current source 631 is mirrored to a node 635 and thus used to control the gate of the MOSFET M2. If the switch 629 is activated, the current of the current source 632 is mirrored to the gate of the MOSFET M2. Hence, the logic unit 501 may indicate to the gate driver to actively charge or discharge the gate of the MOSFET M2.

The charge at the gate of the MOSFET M1 may be maintained via the low power charge pump 507. Also, the charge at the gate of the MOSFET M2 may be maintained via the low power charge pump 507.

A comparator unit 510 comprises a comparator 511 and a reference voltage 512, wherein the first input of the comparator 511 is connected to the gate of the MOSFET M1 and to the gate of the MOSFET M2. The second input of the comparator 511 is connected via the reference voltage 512 to the source of the MOSFET M1 as well as to the source of the MOSFET M2. The output of the comparator 511 is connected to the logic unit 501. The reference voltage 512 allows adjusting the offset between the voltage difference between the MOSFETs M1 and M2.

It is noted that instead of the comparator unit 510, which combines measuring the voltages across the MOSFETs M1 and M2, two comparator units may be provided, each for one of the MOSFETs M1 and M2, providing a voltage difference signal to the logic unit 501.

The solution presented herein may be used in various scenarios. For example, the power switch can be implemented in devices which operate in various states. One example is a vehicle that may have different power consuming stages, which could be mapped to the states of the power switch described herein. Also, the power switch could be used as a circuit breaker, e.g., for energy supplies, batteries or the like. Another alternative for the power switch is to implement a (controlled) fuse and/or any kind of relay switching function.

The examples suggested herein may in particular be based on at least one of the following solutions. In particular combinations of the following features could be utilized in order to reach a desired result. The features of the method could be combined with any feature(s) of the device, apparatus or system or vice versa.

A circuitry is provided, said circuitry comprising
  a first electronic switch with an isolated gate;
  a second electronic switch with an isolated gate;
  a measuring device for determining a charge at the isolated gate of the first electronic switch and at the isolated gate of the second electronic switch;
  an energy supply for providing charge to the isolated gate of the first electronic switch and to the isolated gate of the second electronic switch based on the charge determined by the measuring device;
  a logic unit for activating either the first electronic switch, both or none of the electronic switches.

Hence, based on the logic unit and based on the measuring device, several states of the circuitry are supplied. In a first IDLE state, both electronic switches are active, the measuring device in combination with the energy supply ensure that the charges at the gates do not fall below a predetermined threshold. In a first ON state, both electronic switches are active in a high current mode. In a second ON state, only one of the electronic switches is active supporting a low current mode with the capability of sensing a lower current than in the first ON state. In a second IDLE mode, power saving of the circuitry is active: Only one of the electronic switches is active and the measuring device in combination with the energy supply ensure that the charge at the gate does not fall below a predetermined threshold.

The measuring device may comprise at least one measuring device for each of the electronic switches. It is noted that each of the electronic switches, i.e. the first electronic switch and/or the second electronic switch, may comprise at least one electronic switch, in particular several electronic switches.

The logic unit may activate or deactivate the electronic switches via at least one driver.

In an embodiment, the first electronic switch is a lower power switch compared to the second electronic switch.

The first electronic switch and the second electronic switch may share a chip area (e.g., DMOS area), wherein the first electronic switch has a smaller portion of this area compared to the second electronic switch. A ratio of the area used by the first electronic switch compared to the area used by the second electronic switch may amount to, e.g., 1:200.

In an embodiment, the energy supply is arranged to either supply a high amount of charge or a low amount of charge to the isolated gates of the electronic switches.

In the first IDLE state and the second IDLE state, the low amount of charge may be supplied to the gates of the electronic switches. In particular, in the first IDLE state, the low amount of charge may be supplied to the gates first and the second electronic switch, whereas in the second IDLE state, the low amount of charge may be supplied to the gate of the first electronic switch.

In an embodiment, the energy supply comprises at least one of the following:
- a single charge pump;
- a single charge pump with a low power mode and a high power mode;
- a low power charge pump and a high power charge pump;
- more than two charge pumps with at least two of these charge pumps having different power;
- at least one current source and a current mirror;
- a high current path and a low current path, wherein the high current path comprises at least one high current source and the low current path comprises at least one low current source.

In an embodiment, the comprises a first driver that is coupled between the energy supply and the isolated gate of the first electronic switch and a second driver that is coupled between the energy supply and the isolated gate of the second electronic switch.

In an embodiment, the logic unit is arranged for directly or indirectly controlling the energy supply, the first electronic switch and the second electronic switch, wherein the measuring device is connected to the logic unit to supply the charge determined or an information of the charge determined to the logic unit.

In an embodiment, the energy supply comprises a low power charge pump and wherein the logic unit is arranged to select the low power charge pump at least partially during at least one IDLE state.

In an embodiment, the at least one IDLE state is entered if a device to which the circuitry is connected enters a low power mode.

In an embodiment, the electronic switch is temporarily re-activated from the at least one IDLE state if the charge at the isolated gate drops below a predefined threshold.

In an embodiment, the logic unit is arranged to
- based on a trigger, re-activate the electronic switch from the at least one IDLE state by supplying its isolated gate with a higher amount of charge compared to the charge provided during the at least one IDLE state,
- perform a predefined action and
- re-activate the at least one IDLE state.

In an embodiment, the trigger is at least one of the following:
- an external signal applied to the logic unit;
- a detection of a failure;
- a detection of a temperature exceeding a predetermined threshold;
- a detection of a current exceeding a predetermined threshold;
- a trigger provided by a timer or a clock.

In an embodiment, the predefined action comprises at least one of the following:
- a current sensing;
- a temperature sensing;
- issuing a notification;
- a re-charging of the isolated gate.

In an embodiment, the circuitry comprises a measuring unit to determine at least one of the following triggers:
- a temperature exceeding a predetermined threshold;
- a current exceeding a predetermined threshold;
- a change of polarity;
- current flowing in the wrong direction that may be harmful for logic circuitry;
- a timer.

In an embodiment, the energy supply comprises a high power charge pump and wherein the logic unit is arranged to select the high power charge pump at least partially during at least one ON state.

In an embodiment, the at least one ON state is entered if a device to which the circuitry is connected enters a normal operation mode.

In an embodiment, the logic unit is arranged to switch the electronic switch to an OFF state in case a short-circuit or over-temperature is detected or in case of a predefined signal is applied to the logic unit.

In an embodiment, the measuring device comprises a comparator unit, wherein the inputs of the comparator unit are connected to the first electronic switch and/or to the second electronic switch to determine a voltage across to terminals of the electronic switch.

In an embodiment, the circuitry is arranged to be operated in either one of the following states:
- a first ON state, in which a high amount of charge is supplied via the energy supply to the isolated gate of the first electronic switch and the second electronic switch;
- a second ON state, in which a high amount of charge is supplied via the energy supply to the isolated gate of the first electronic switch;
- a first IDLE state in which a low amount of charge is supplied via the energy supply to the isolated gate of the first electronic switch and the second electronic switch;
- an OFF state in which the first electronic switch and the second electronic switch are switched off.

In an embodiment, the logic unit initiates a transition from the first ON state to the second ON state in case a load current reaches or falls below a predetermined threshold.

In an embodiment, the circuitry is arranged to be operated in the following state:
- a second IDLE state in which a low amount of charge is supplied via the energy supply to the isolated gate of the first electronic switch.

In an embodiment, the logic unit initiates a transition from the first ON state to the second IDLE state in case a load current reaching or falling short of a predetermined threshold is detected and/or diagnostic and/or sensing functionality is not required.

In an embodiment, the logic unit initiates a transition from the first IDLE state to the second IDLE state in case a load current reaching or falling short of a predetermined threshold is detected and/or in case no diagnostic and/or sensing functionality is required.

In an embodiment, the circuitry comprises a memory for storing at least one state.

In an embodiment, the electronic switch comprises at least one of the following:
- a transistor,
- a PMOSs,
- an NMOS,
- a FET,
- a JFET,
- an IGBT.

In an embodiment, the electronic switch is an n-channel high side switch.

A vehicle is provided, said vehicle comprising at least one circuitry as described herein.

Further, a method is provided for controlling a first electronic switch with an isolated gate and a second electronic switch with an isolated gate, the method comprising the steps:
- determining charge at the isolated gate of the first electronic switch and at the isolated gate of the second electronic switch;

providing charge to the isolated gate of the first electronic switch and the isolated gate of the second electronic switch based on the charge determined;

activating either the first electronic switch, both or none of the electronic switches.

In an embodiment, the electronic switches are operated in either one of the following states:
- a first ON state, in which a high amount of charge is supplied via the energy supply to the isolated gate of the first electronic switch and the second electronic switch;
- a second ON state, in which a high amount of charge is supplied via the energy supply to the isolated gate of the first electronic switch;
- a first IDLE state in which a low amount of charge is supplied via the energy supply to the isolated gate of the first electronic switch and the second electronic switch;
- an OFF state in which the first electronic switch and the second electronic switch are switched off.

In an embodiment, a transition is conducted from the first ON state to the second ON state in case a load current reaches or falls below a predetermined threshold.

In an embodiment, the electronic switches are operated in the following state:
- a second IDLE state in which a low amount of charge is supplied via the energy supply to the isolated gate of the first electronic switch.

In an embodiment, a transition is conducted from the first ON state to the second IDLE state in case a load current reaches or falls short of a predetermined threshold and/or a diagnostic and/or sensing functionality is not required.

In an embodiment, a transition is conducted from the first IDLE state to the second IDLE state in case a load current reaching or falling short of a predetermined threshold is detected and/or in case no diagnostic and/or sensing functionality is required.

In an embodiment, the first IDLE state or the second IDLE state is entered if a device to which the electronic switches are connectable enters a low power mode.

In an embodiment,
- the first electronic switch and the second electronic switch are re-activated from the first IDLE state to the first ON state if the charge at the isolated gate drops below a predefined threshold;
- the charge at the isolated gate is increased;
- the first IDLE state is re-entered.

In an embodiment,
- based on a trigger, a state transition from the first IDLE state to the first ON state or from the second IDLE state to the second ON state or from the second IDLE state to the first ON state is conducted,
- a predefined action is performed;
- the first IDLE state or the second IDLE state is re-activated.

In an embodiment, the trigger is at least one of the following:
- an external signal applied to the logic unit;
- a detection of a failure;
- a detection of a temperature exceeding a predetermined threshold;
- a detection of a current exceeding a predetermined threshold;
- a trigger provided by a timer or a clock.

In an embodiment, the predefined action is at least one of the following:
- a current sensing;
- a temperature sensing;
- issuing a notification;
- a re-charging of the isolated gate.

In an embodiment, the electronic switch enters the OFF state in case a short-circuit or over-temperature is detected or in case of a predefined signal.

Also, an electronic switching circuitry is provided, said electronic switching circuitry comprising:
- means for determining charge at an isolated gate of a first electronic switch and at an isolated gate of a second electronic switch;
- means for providing charge to the isolated gate of the first electronic switch and the isolated gate of the second electronic switch based on the charge determined;
- means for activating either the first electronic switch, both or none of the electronic switches.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A circuitry comprising a first electronic switch with an isolated gate;
a second electronic switch with an isolated gate;
a measuring device for determining a charge at the isolated gate of the first electronic switch and at the isolated gate of the second electronic switch;
an energy supply for providing charge to the isolated gate of the first electronic switch and to the isolated gate of the second electronic switch based on the charge determined by the measuring device, and wherein the energy supply is arranged to either supply a high amount of charge or a low amount of charge to the isolated gates of the electronic switches;
a logic unit for activating the first electronic switch, both or none of the electronic switches.

2. The circuitry according to claim 1, wherein the first electronic switch has a lower maximum current capability compared to the second electronic switch.

3. The circuitry according to claim 1, wherein the energy supply comprises at least one of the following:
a single charge pump;
a single charge pump with a low power mode and a high power mode;
a low power charge pump and a high power charge pump;
more than two charge pumps with at least two of these charge pumps having different power;
at least one current source and a current mirror; or
a high current path and a low current path, wherein the high current path comprises at least one high current source and the low current path comprises at least one low current source.

4. The circuitry according to claim 1, further comprising a first driver that is coupled between the energy supply and the isolated gate of the first electronic switch and a second driver that is coupled between the energy supply and the isolated gate of the second electronic switch.

5. The circuitry according to claim 1, wherein the logic unit is arranged for directly or indirectly controlling the energy supply, the first electronic switch and the second electronic switch, wherein the measuring device is connected to the logic unit to supply the charge determined or an information of the charge determined to the logic unit.

6. The circuitry according to claim 5, wherein the energy supply comprises a low power charge pump and wherein the logic unit is arranged to select the low power charge pump at least partially during at least one IDLE state.

7. The circuitry according to claim 6, wherein the at least one IDLE state is entered if a device to which the circuitry is connected enters a low power mode.

8. The circuitry according to claim 6, wherein at least one of the first and second electronic switches is temporarily reactivated from the at least one IDLE state if the charge at the isolated gate drops below a predefined threshold.

9. The circuitry according to claim 6, wherein the logic unit is arranged to
based on a trigger, reactivate the electronic switch from the at least one IDLE state by supplying its isolated gate with a higher amount of charge compared to the charge provided during the at least one IDLE state,
perform a predefined action, and
reactivate the at least one IDLE state.

10. The circuitry according to claim 9, wherein the trigger is at least one of the following:
an external signal applied to the logic unit;
a detection of a failure;
a detection of a temperature exceeding a predetermined threshold;
a detection of a current exceeding a predetermined threshold; or
a trigger provided by a timer or a clock.

11. The circuitry according to claim 9, wherein the predefined action comprises at least one of the following:
a current sensing;
a temperature sensing;
issuing a notification; or
a recharging of the isolated gate.

12. The circuitry according to claim 9, further comprising a measuring unit to determine at least one of the following triggers:
a temperature exceeding a predetermined threshold;
a current exceeding a predetermined threshold;
a change of polarity; or
current flowing in the wrong direction that may be harmful for logic circuitry;
a timer.

13. The circuitry according to claim 5, wherein the energy supply comprises a high power charge pump and wherein the logic unit is arranged to select the high power charge pump at least partially during at least one ON state.

14. The circuitry according to claim 13, wherein the at least one ON state is entered if a device to which the circuitry is connected enters a normal operation mode.

15. The circuitry according to claim 5, wherein the logic unit is arranged to switch at least one of the first and second electronic switches to an OFF state in case a short-circuit or over-temperature is detected or in case of a predefined signal is applied to the logic unit.

16. The circuitry according to claim 1, wherein the measuring device comprises a comparator unit, wherein inputs of the comparator unit are connected to at least one of the first electronic switch or to the second electronic switch to determine a voltage across to terminals of the electronic switch.

17. The circuitry according to claim 1, wherein the circuitry is arranged to be operated in at least one of the following states:
a first ON state, in which a high amount of charge is supplied via the energy supply to the isolated gate of the first electronic switch and the second electronic switch;
a second ON state, in which a high amount of charge is supplied via the energy supply to the isolated gate of the first electronic switch;
a first IDLE state in which a low amount of charge is supplied via the energy supply to the isolated gate of the first electronic switch and the second electronic switch; or
an OFF state in which the first electronic switch and the second electronic switch are switched off.

18. The circuitry according to claim 17, wherein the logic unit initiates a transition from the first ON state to the second ON state in case a load current reaches or falls below a predetermined threshold.

19. The circuitry according to claim 17, wherein the circuitry is arranged to be operated in the following state:
a second IDLE state in which a low amount of charge is supplied via the energy supply to the isolated gate of the first electronic switch.

20. The circuitry according to claim 19, wherein the logic unit initiates a transition from the first ON state to the second IDLE state in case a load current reaching or falling short of at least one of a predetermined threshold is detected or diagnostic or sensing functionality is not required.

21. The circuitry according to claim 19, wherein the logic unit initiates a transition from the first IDLE state to the second IDLE state in case a load current reaching or falling short of at least one of a predetermined threshold is detected or in case no diagnostic or sensing functionality is required.

22. The circuitry according to claim 1, wherein the electronic switch comprises at least one of the following:
a transistor,
a PMOSs,
an NMOS,
a FET,
a JFET, or
an IGBT.

23. The circuitry according to claim 1, wherein the electronic switch is an n-channel high side switch.

24. A vehicle comprising at least one circuitry according to claim 1.

25. A method for controlling a first electronic switch with an isolated gate and a second electronic switch with an isolated gate, comprising:
determining charge at the isolated gate of the first electronic switch and at the isolated gate of the second electronic switch;
providing charge to the isolated gate of the first electronic switch and the isolated gate of the second electronic switch based on the charge determined;
activating either the first electronic switch, both or none of the electronic switches,
wherein the electronic switches are operated in at least one of the following states:
a first ON state, in which a high amount of charge is supplied via the energy supply to the isolated gate of the first electronic switch and the second electronic switch;
a second ON state, in which a high amount of charge is supplied via the energy supply to the isolated gate of the first electronic switch;

a first IDLE state in which a low amount of charge is supplied via the energy supply to the isolated gate of the first electronic switch and the second electronic switch;

an OFF state in which the first electronic switch and the second electronic switch are switched off.

26. The method according to claim 25, wherein a transition is conducted from the first ON state to the second ON state in case a load current reaches or falls below a predetermined threshold.

27. The method according to claim 25, wherein the electronic switches are operated in the following state:

a second IDLE state in which a low amount of charge is supplied via the energy supply to the isolated gate of the first electronic switch.

28. The method according to claim 27, wherein a transition is conducted from the first ON state to the second IDLE state in case a load current reaches or falls short of at least one of a predetermined threshold for a diagnostic or sensing functionality is not required.

29. The method according to claim 27, wherein a transition is conducted from the first IDLE state to the second IDLE state in case a load current reaching or falling short of at least one of a predetermined threshold is detected or in case no diagnostic or sensing functionality is required.

30. The method according to claim 27, wherein the first IDLE state or the second IDLE state is entered if a device to which the electronic switches are connectable enters a low power mode.

31. The method according to claim 25, wherein the first electronic switch and the second electronic switch are reactivated from the first IDLE state to the first ON state if the charge at the isolated gate drops below a predefined threshold;

the charge at the isolated gate is increased;

the first IDLE state is re-entered.

32. The method according to claim 27, wherein based on a trigger, a state transition from the first IDLE state to the first ON state or from the second IDLE state to the second ON state or from the second IDLE state to the first ON state is conducted, a predefined action is performed;

the first IDLE state or the second IDLE state is reactivated.

33. The method according to claim 32, wherein the trigger is at least one of the following:

an external signal applied to the logic unit;

a detection of a failure;

a detection of a temperature exceeding a predetermined threshold;

a detection of a current exceeding a predetermined threshold; or a trigger provided by a timer or a clock.

34. The method according to claim 32, wherein the predefined action is at least one of the following:

a current sensing;

a temperature sensing;

issuing a notification; or a re-charging of the isolated gate.

35. The method according to claim 25, wherein the electronic switch enters the OFF state in case a short-circuit or over-temperature is detected or in case of a predefined signal.

36. An electronic switching circuitry comprising:

means for determining charge at an isolated gate of a first electronic switch and at an isolated gate of a second electronic switch;

means for providing charge to the isolated gate of the first electronic switch and the isolated gate of the second electronic switch based on the charge determined;

means for activating the first electronic switch, both electric switches concurrently, or none of the electronic switches.

* * * * *